United States Patent [19]

Glogolja et al.

[11] 4,375,073
[45] Feb. 22, 1983

[54] DUAL-MONITORING PROTECTION CIRCUIT FOR SWITCHING TRANSISTOR

[75] Inventors: Miroslav Glogolja, Somerville; Arthur A. Baumgarten, Morris Plains, both of N.J.

[73] Assignee: Reliance Electric Company, Cleveland, Ohio

[21] Appl. No.: 159,835

[22] Filed: Jun. 16, 1980

[51] Int. Cl.³ ............................................... H02H 3/38
[52] U.S. Cl. ........................................ 361/91; 361/98; 361/101
[58] Field of Search .................. 361/91, 101, 86, 88, 361/92, 98, 94; 307/200 A; 330/207 P, 298

[56] References Cited

U.S. PATENT DOCUMENTS

| | | | |
|---|---|---|---|
| 3,408,589 | 10/1968 | Nishioka | 330/51 |
| 3,449,598 | 6/1969 | Wright | 361/98 X |
| 3,534,249 | 10/1970 | Neill et al. | 361/98 X |
| 3,854,089 | 12/1974 | Emler | 324/96 |
| 3,914,667 | 10/1975 | Waldron | 361/94 |
| 3,946,301 | 3/1976 | Love | 321/11 |
| 4,158,866 | 6/1979 | Baker | 361/92 X |

FOREIGN PATENT DOCUMENTS 1187402  4/1970  United Kingdom .

*Primary Examiner*—Reinhard J. Eisenzopf
*Attorney, Agent, or Firm*—Allan M. Lowe; Kenneth Watov

[57] ABSTRACT

A transistor having a selectively saturated emitter collector path is protected.

The emitter collector voltage level is sensed as being greater than a predetermined level to indicate saturation as is the presence and absence of drive current to the base. In response to the transistor not being activated to saturation while the drive current is applied to the base, a fault indication is derived. In response to the fault being indicated, the transistor is prevented from conducting by decoupling a source of operating voltage and current from the emitter collector path and/or decoupling the drive current from the base.

17 Claims, 3 Drawing Figures

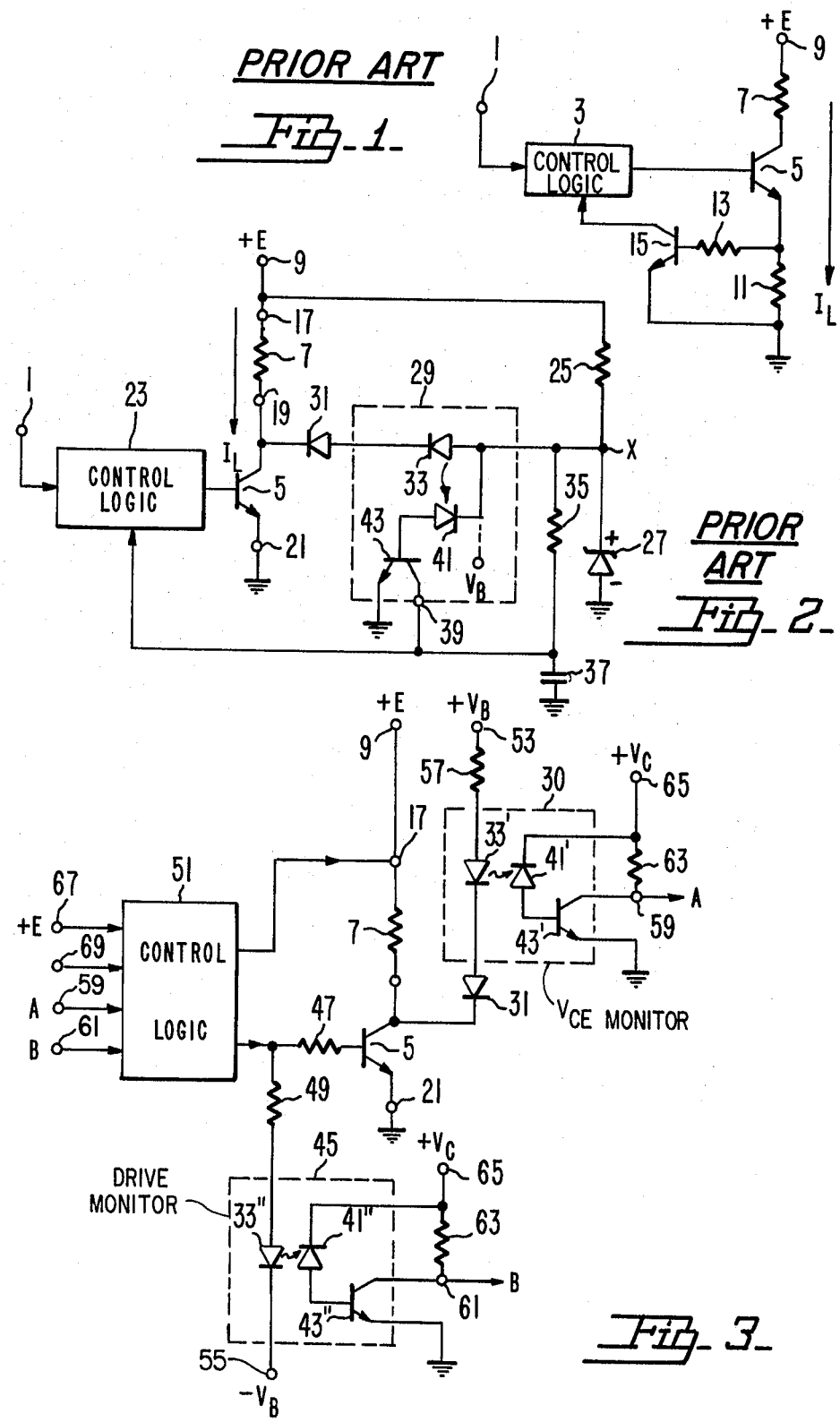

DUAL-MONITORING PROTECTION CIRCUIT FOR SWITCHING TRANSISTOR

The field of the present invention relates generally to protection circuits for transistors, and more particularly to protection circuits for switching transistors.

In solid-state switching circuits, one or more power transistors are often used as load switches. For reliable operation of the switching circuit, the output transistors must be protected from excessive power dissipation during fault conditions, such as a shorted load causing higher-than-rated current to flow through the main current paths of the output transistors. In high-power switching circuits, it is important that the protection circuit itself (1) not dissipate large amounts of power, (2) be insensitive to relatively short-lived transients, and (3) be insensitive to normal operation of the circuit causing sequential turning on and turning off of various transistors in the output stage of the circuit. In applications where the output stage includes a plurality of transistors having the main current paths thereof connected in series, it is important that the protection circuit have a floating reference potential, with the capability of electrically isolating the output stage of the protection circuit from the operating voltages associated with the switching transistors being protected.

The present invention includes both a method and circuit for protecting a switching transistor from excessive power dissipation. The transistor includes a control electrode for receiving a drive signal and a main current path between first and second electrodes connected to opposite terminals of an operating voltage source. The voltage level between the first and second electrodes and the presence of a drive signal at the control electrode are sensed. In response to the voltage level being respectively greater than a predetermined reference, an indication is derived that the main current path is respectively not in saturation and in saturation. In response to the transistor not being in saturation and drive current for the control electrode being present, there is a fault. Therefore, in response to the transistor not being in saturation upon completion of a predetermined interval, at least equal to the time required for the transistor to become saturated after drive is initially applied to the control electrode, conduction of the transistor is prevented. To assure rapid prevention of transistor conduction, a source of operating voltage and current from the main current path is decoupled from that path. This is followed by removal of the control electrode drive current. The drive current is initially applied only if the transistor is not in saturation at the time a turn on command for the drive current is initially derived. If the transistor comes out of saturation while the drive signal is applied, as can occur if a fault exists, the base drive is removed in response to the sensed high voltage across the first and second electrodes and the base drive current being present.

In the drawings, where like items are indicated by the same reference designation:

FIG. 1 is a circuit schematic diagram of a prior art circuit for protecting a transistor;

FIG. 2 is a circuit schematic diagram of another prior art circuit for protecting a transistor; and FIG. 3 is a circuit schematic diagram of a preferred embodiment of the present invention.

In the circuit of FIG. 1, when a control signal is applied to control terminal 1, the control logic 3 responds by applying a turn-on signal to the base electrode of the switching transistor 5. In response to turn on of switching transistor 5, there is a substantially lowering of the impedance between its collector and emitter electrodes, so current $I_L$ flows through a load resistor 7 connected between the collector electrode of the transistor 5 and an operating voltage terminal 9. The operating voltage terminal 9 is adapted for receiving an operating voltage $+E$. A sensing resistor 11 is provided in the emitter circuit of the transistor 5 for sensing the magnitude of the current $I_L$. Whenever the magnitude of the load current $I_L$ increases in magnitude to above a predetermined value, the voltage drop across the resistor 11 is applied via input resistor 13 across the base emitter junction of the protection transistor 15, for turning on this transistor 15. When transistor 15 so turns on, a source of reference potential, ground in this example, is applied to the control logic 3, for operating the logic 3 for removing the turn-on signal or base drive from the base electrode of the output transistor 5, turning off transistor 5. This method of protecting a transistor is known as "current sensing." Such a current sensing protection circuit is usable for low currents having magnitudes up to about 50 amperes, but above 50 amperes excessive power dissipation occurs in the sensing resistor 11. Such excessive dissipation occurs because the voltage drop across sensing resistor 11 must be about one volt, for turning on the protection transistor 15. Accordingly, if the protection transistor 15 is to be turned on when the load current attains a magnitude of about 50 amperes, then almost 50 watts of power will be dissipated in the sensing resistor 11 at the time of turn-on of transistor 15. The resistance of the sensing resistor 11 can be reduced to limit the power dissipation of this resistor, but this means that the protection circuit transistor 15 must be turned on at correspondingly lower values of voltage across resistor 11, which unfortunately causes noise problems. In such high-power switching circuits, operating above 50 amperes, the rate of load current increase (dI/dT) becomes so large during turn-on of the output transistor 5 that the residual series inductances within the circuit cause large voltage spikes, which must be filtered. Such filtering slows down the response of the switching circuit, decreases the turn-off time of the switching circuit and consequently can allow the "protected transistor" to burn out because of the inability of the protection circuit to respond in time.

In U.S. Pat. No. 4,158,866, for "Protection Circuit For Transistorized Switch," issued on June 19, 1979, the protection circuit of FIG. 2 is disclosed for substantially eliminating the problems of power dissipation of the protection circuit in high-power switching circuits, and the inherent noise problems encountered in using current-sensing techniques. These problems are overcome by employing voltage or impedance sensing of the collector-emitter voltage $V_{CE}$ of the power transistor 5 being protected. As shown, the circuit includes the output transistor 5 being protected, output terminals 17 and 19, connected to a load 7, a first terminal 9 for receiving an operating voltage $+E$, a second terminal 21 connected to a source of reference potential, ground in this example, a control logic network 23 for applying a high or digital 1 signal to the base of transistor 5 for turning this transistor on, or a low-level or digital 0 signal to the base electrode for turning transistor 5 off. A positive polarity DC reference voltage is produced at node X by the combination of resistor 25 and zener diode 27. This reference voltage is lower in value than the operating DC voltage +E applied to terminal 9. The zener diode 27 could be replaced by a resistor, but it is preferred that a zener diode 27 be used to ensure regulation of the DC reference voltage even with fluctuations in the value of the operating voltage +E. An optical coupler 29 is connected in series circuit with a blocking diode 31 (the blocking diode protects the light-emitting diode 33 from burnout due to excessive values of reverse bias voltage) between the collector electrode transistor 5 and node or point X, as shown. An RC timing circuit 35,37 is connected between node X and ground, with the common connection of the resistor 35 and capacitor 37 being connected to the output terminal 39 of the optical coupler 29.

In operation of the circuit of FIG. 2, a turn-on signal is applied to input terminal 1, for operating the control logic network 23 to apply a high-level signal to the base electrode of NPN transistor 5, turning on this transistor to lower the emitter collector impedance thereof. In response to turn off of transistor 5, the $V_{CE}$ of transistor 5 is reduced from +E to a relatively low voltage value of voltage, and current $I_L$ flows through the load 7 and collector-emitter path of transistor 5 to ground. Assume that transistor 5 is now in its low impedances saturated conduction state. The DC reference voltage at node X, in this case the zener diode 27 voltage rating, has a voltage level greater than the sum of forward-conducting voltage drops of the light-emitting diode (LED) 33, the blocking diode 31, and the saturation $V_{CE}$ voltage of transistor 5. Accordingly, with transistor 5 in saturation, current flows from node X, through the LED 33 and blocking diode 31 into the collector electrode of transistor 5, causing the LED 33 to emit light. Resistor 25 provides a current source, and a voltage $V_x$ at node X is equal to the zener voltage of 27, as previously mentioned. Accordingly, when the sum of $V_{CE}$ of transistor 5 and forward voltage drops of diodes 31 and 33 is less than the zener voltage of 27, then the magnitude of the current flowing through diodes 31, 33 is substantially independent of the difference of the levels of $V_{CE}$ of transistor 5 and $V_x$. The light from LED 33 is detected by light-sensitive diode or photodiode 41, which responds by reducing its impedance, permitting base current to flow from node X into the base of transistor 43, turning on this transistor. The cathode of photodiode 41 does not have to be connected to node X, but can be alternatively connected to receive some independent source of operating voltage $V_B$, as shown in phantom. During turn on of transistor 43, collector 39 thereof is near ground to indicate normal operation of the switching transistor 5. Simultaneously control logic 23 is programmed to continue to apply a high-level signal to the base electrode of transistor 5, so long as a turn-off signal is not applied to the input terminal 1 thereof. If a fault condition occurs, such as the load 7 being shorted, causing higher-than-rated load current $I_L$ to flow through transistor 5, transistor 5 comes out of saturation, causing a rise in the impedance and the voltage levels between the transistor collector-emitter electrodes $V_{CE}$. When $V_{CE}$ rises to a level where the sum of the $V_{CE}$ plus the forward voltage drops across diode 31 and LED 33 are equal or greater than the level of the DC reference voltage at node X, current no longer flows through the LED 33. LED 33 stops emitting light as a result of the absence of current flow therethrough; the impedance of photodiode 41 increases in response to the absence of light thereby preventing the flow of current into the base electrode of transistor 43, which turns off. When transistor 43 turns off, the voltage at output terminal 39 (considered a fault terminal) increases from ground to the level of the DC reference voltage at node X. In the absence of capacitor 37, the high-level fault signal so developed at output terminal 39 occurs substantially immediately after turn off of transistor 43; the high-level fault signal is applied to the control logic 23, which responds by removing the base drive to transistor 5 (grounding or applying a load-level signal to the base electrode), causing transistor 5 to turn off, regardless of the level of the signal applied to input terminal 1. In certain applications, it is desirable to delay the application of the fault signal or high-level signal at output terminal 39 to the control logic for a predetermined duration or period of time, to avoid false triggering of the control logic 23 due to short-lived transient conditions that may occur in the normal operation of the switching circuit. Such a time delay can be readily provided by the inclusion of capacitor 37 as shown. With capacitor 37 in the circuit, when transistor 43 turns off, the voltage at output terminal 39 rises exponentially from ground towards the level of the DC reference voltage at node X, with a time constant equal to the product of the value of resistor 35 and capacitor 37. This time constant is set at a value for causing the voltage to rise from gound to a triggering level for the control logic in a predetermined time duration required for preventing false triggering due to the transient conditions, but within the period of time required to turn off transistor 5 before damage has occurred. It should be noted that the optical coupler 29 is itself operating as a current sensor, but in combination with the other elements of the protection circuit, is responding directly to the $V_{CE}$ of transistor 5. Other current-sensing circuits can be substituted for the optical coupler 29, but in general do not provide the advantages of noise immunity and low cost of the optical coupler.

The present inventors discovered that the filtering required in FIG. 2 via resistor 35 and capacitor 37, in many applications as previously mentioned, could be eliminated by providing a protection circuit where both the drive signal to the output transistor 5 and the $V_{CE}$ of the transistor are concurrently monitored. In addition to this dual monitoring function of the protection circuit, the inventors discovered another improvement to the circuit of FIG. 2, whereby the operating voltage +E is removed from transistor 5 whenever this transistor is conducting current in the absence of a drive signal at its control electrode, with its $V_{CE}$ being below a predetermined value. The present invention, as shown in FIG. 3, is now described in detail.

In FIG. 3, with comparison to the circuit of FIG. 2, the present invention includes, in addition to an optical coupler 30 for monitoring the $V_{CE}$ of transistor 5, a second optical coupler 45 for monitoring or sensing the presence of a drive signal at the common connection of input resistor 47 and current limiting resistor 49, and a control logic 51. The optical couplers 30,45 of the present invention have no common connection between their respective LED 33 and photodiode 41, unlike the optical coupler 29 of FIG. 2. Accordingly, in this preferred embodiment of the invention, the output circuits of the optical couplers 30 and 45 are substantially electrically isolated from the voltages associated with the switching transistor 5, although in this example a common ground is shown. If desired, because of the inherent electrical isolation provided by optical couplers 30 and 45, the emitter electrodes of transistors 43' and 43", respectively included in couplers 30 and 45, can be connected to a reference voltage or grounding system different from the ground or reference voltage connected to terminal 21, associated with switching transistor 5. In this manner, the output circuits of the optical couplers 30 and 45, each respectively including diodes 41' and 41" and transistors 43', 43" float with respect to the voltages associated with the switching transistor 5. This is important where the protection circuit of FIG. 3 is duplicated many times for protecting each one of the switching transistors of a chain of switching transistors having the main current paths thereof connected in series between operating and reference voltage terminals. Reference terminals 53 and 55 are connected to stable reference voltages $+V_B$ and $-V_B$, respectively, in this example. By using external stable reference voltages $+V_B$ and $-V_B$, respectively, instead of the combination of a resistor and zener diode, such as resistor 25 and zener diode 27 of FIG. 2, the current limiting resistors 49,57, associated with optical couplers 45,30, respectively, can be provided by much lower power, lower voltage resistors than resistor 25. Also, the requirement for a zener diode is eliminated, and the transistor switches in a given switching circuit can each be monitored by identical monitoring circuits, such as 30 and 45, regardless of the individual function of each switching transistor in the circuit; the monitoring circuits or optical couplers 30,45 are not affected by gross changes in the level of the operating voltages $+E$, for example. In addition, by eliminating the filtering or delay circuit 35,37 of FIG. 2, the present protection circuit provides a much faster response time to fault conditions because the only integration needed is for the intense turn-on time ($t_{on}$) of the switching transistor 5. For a typical high-power switching transistor, the $t_{on}$ is less than one microsecond. The optical coupler 30 provides a digital output signal "A" at output terminal 59, and optical coupler 45 similarly provides a digital output signal "B" at its output terminal 61. For each one of the optical couplers 30,45, load resistors 63 are connected between operating voltage terminals 65, for receiving an operating voltage $V_C$, at the output terminals 59,61, respectively. Note that typically the level of $V_C$ is about 15 volts, and that of $V_B$ about 8 volts, whereas the level of the operating voltage $+E$ may be hundreds of volts. The control logic 51 is receptive of the digital signals A and B, the operating voltage $+E$ via terminal 67, and an externally applied drive or control signal via terminal 69.

Operation of the circuit of FIG. 3 is now described. Assume that initially the circuit is turned off, and that at some time $t_o$ an operating voltage $+E$ is applied to terminal 67 of control logic 51, the stable reference voltages $+V_B$ and $-V_B$ to terminals 53,55, respectively, and the operating voltage $+V_C$ (digital level operating voltage) to terminals 65. Regardless of the application of a drive signal to terminal 69 at this time, the control logic is programmed to apply the operating voltage $+E$ to terminal 17, and the switching transistor 5 is turned off. Accordingly, the $V_{CE}$ of transistor 5 has a level of about $+E$, backbiasing diodes 31 and 33, causing optical coupler 30 to be turned off. With transistor 43 of optical coupler 30 turned off, the level of digital signal "A" approaches the level of voltage $+V_C$, representing a digital "1" level. Similarly, assuming the absence of a drive signal at terminal 69, the control logic 51 is operative for supplying a voltage that is less than $-V_B$ by at least one diode drop of diode 33, at the common connection of resistors 47,49, causing diode 33 to be backbiased and the optical coupler 45 turned off, in turn, causing transistor 43" of optical coupler 45 to be turned off, whereby the level of digital signal "B" approaches that of the operating voltage $+V_C$, or a digital "1" level.

Assuming that the circuit of FIG. 3 is operating normally, when a drive signal is now applied to terminal 69, the control logic 51 is programmed to switch through the drive signal to the common connection of resistors 47, 49, for applying the drive signal to the base electrode of switching transistor 5, and for causing current to flow through LED 33 of coupler 45.

The LED 33 of optical coupler 45 responds to the flow of current therein by emitting a beam of light which is detected by diode 41, the latter responding by substantially reducing the impedance between its anode and cathode electrodes, for permitting base current to flow in transistor 43", turning the latter on, which substantially reduces the impedance between its collector and emitter electrodes, causing the level of voltage at output terminal 61 to approach the level of the reference voltage at the emitter of transistor 43, in this example ground. Accordingly, the level of digital signal "B" changes from a digital "1" to a "0." When digital signal "B" is 1, there is an absence of a drive signal at the base electrode of switching transistor 5, and conversely when the level of digital signal "B" is "0," there is a drive signal at the base electrode of transistor 5. The control logic 51 is programmed to initially apply the drive signal to the base of transistor 5 for at least the period of time required for turning on this transistor, provided that A is "1" (if A is "0" concurrent with B being "1," transistor 5 is shorted). However, if switching transistor 5 does not turn on in the predetermined or programmed time period, digital signal A will remain a digital "1" and digital signal "B" will be at digital "0" because of the continued presence of the drive signal, whereby the control logic is programmed to respond by removing the operating voltage $+E$ from output terminal 17 for operating voltage terminal 9. The failure of transistor 5 to turn on in the predetermined period of time indicates that a fault condition exists in circuit of FIG. 3.

Assume that switching transistor 5 turns on within the predetermined time programmed into the control logic 51. Upon turning on, the $V_{CE}$ of transistor 5 reduces to the saturation voltage value of transistor 5, in normal operation. The level of the stable reference voltage $+V_B$ is made greater than the saturation voltage of transistor 5 by at least the sum of the forward voltage drops of diodes 31' and 33', causing current to flow through LED 33' of optical coupler 30, for turning on transistor 43 thereof, causing the level of digital signal A to go from $+V_C$ to about ground, in this example, that is to change from a digital "1" to a digital "0." Accordingly, when the level of A is a digital "1," this is indicative of switching transistor 5 being turned off or nonconductive, and conversely when digital switch A is a digital "0," this is indicative of switching transistor 5 being turned on into a saturated conduction state, in this example. If some transient condition, such as a sudden short in the load 7, causes excess current to flow into the collector electrode of transistor 5, the transistor is forced to come out of saturation, causing its $V_{CE}$ to increase in level above its saturation voltage level, as previously described. In turn, diodes 31 and 33 of coupler 30 become backbiased, causing the cessation of light emittance by LED 33 of optical coupler 30, in turn causing photodiode 41 thereof to substantially increase its resistance for turning off transistor 43, for changing the level of signal A from a digital "0" to a digital "1." Control logic 51 responds to the change in level of signal A by removing the drive signal from the common connection of resistors 47,49.

In normal operation of this circuit, once switching transistor 5 has been placed into a conductive state, if the drive signal is thereafter removed from terminal 69 of the control logic, the control logic 51 will in turn respond by removing the base drive signal from transistor 5. In other words, the control logic 51 may include analog and digital logic for merely switching the drive signal from terminals 69 to the common connection of resistors 47 and 49, for turning on transistor 5 and maintaining this transistor conductive, under normal operating conditions. Alternatively, the control logic 51 can be configured to respond to the presence of a control signal or input signal at terminal 69 for operating to provide an internally generated drive signal for turning on and maintaining turned on the transistor 5.

The control logic 51 can include hardwired digital logic configured for driving analog switches, for example, in response to the levels of digital signals A and B, and the presence of a drive or control signal at terminal 69, for applying the operating voltage +E and drive signal to the switching transistor 5, as previously described. Also, the control logic 51 can alternatively include a microprocessor programmed to respond to the levels of the digital signals A and B, and the presence of a drive signal at terminal 69, as previously described for the functioning of the control logic 51. If desired, the control logic 51 can be programmed to periodically automatically reset itself after a fault condition has occurred, for reinstituting normal operation of the switching transistor 5 if the fault condition has been removed. Alternatively, a manual reset can be provided for the control logic 51, for resetting the control logic manually after a fault condition has occurred.

What is claimed is:

1. Apparatus for monitoring a fault in a main current conducting path of a transistor activated into saturation between first and second opposite electrodes of the path in response to a drive current applied to a control electrode of the transistor, the fault occurring with the drive current being applied to the control electrode while the transistor is not in saturation, comprising first sensing means for detecting that the transistor is and is not activated to saturation, second sensing means for detecting the presence of drive current to the control electrode, and means responsive to the first and second sensing means for indicating a fault in response to the first sensing means detecting that the transistor is not activated to saturation while the second sensing means detects the presence of the drive current.

2. The apparatus of claim 1 wherein the first sensing means includes means responsive to the voltage between the electrodes for deriving a saturation indicating signal having first and second levels in response to the voltage between the electrodes being respectively greater than and not greater than a predetermined level associated with the saturation voltage across the first and second electrodes.

3. The apparatus of claim 2 wherein the saturation indicating signal deriving means includes a light emitting diode connected in a first branch connected to a terminal of the main conducting path, the terminal being responsive to operating voltage and current for the transistor from a second branch including a power supply terminal for the main conducting path, the first and second branches being separate from each other, the light emitting diode having first and second light emitting states in response to the voltage between the first and second electrodes being respectively greater than and not greater than the predetermined level.

4. Apparatus for protecting against a fault in a main current conducting path of a transistor activated into saturation between first and second opposite electrodes of the path in response to a drive current applied to a control electrode of the transistor, the fault occurring with the drive current being applied to the control electrode while the transistor is not in saturation, comprising first sensing means for detecting that the transistor is and is not activated to saturation, second sensing means for detecting the presence of drive current to the control electrode, and means responsive to the first and second sensing means for preventing conduction of the transistor main current path in response to the first sensing means detecting that the transistor is not activated to saturation while the second sensing means detects the presence of the drive current.

5. The apparatus of claim 4 wherein the first sensing means includes means responsive to the voltage between the electrodes for deriving a saturation indicating signal having first and second levels in response to the voltage between the electrodes being respectively greater than and not greater than a predetermined level associated with the saturation voltage across the first and second electrodes.

6. The apparatus of claim 5 wherein the saturation indicating signal deriving means includes a light emitting diode connected in a first branch connected to a terminal of the main conducting path, the terminal being responsive to operating voltage and current for the transistor from a second branch including a power supply terminal for the main conducting path, the first and second branches being separate from each other, the light emitting diode having first and second light emitting states in response to the voltage between the first and second electrodes being respectively greater than and not greater than the predetermined level.

7. The apparatus of claim 4, 5 or 6 wherein the means for preventing transistor conduction is responsive to the transistor not being in saturation upon completion of a predetermined interval after the drive current is initially applied to the control electrode, the predetermined interval being at least the time required for the transistor to become saturated after drive current is initially supplied to the control electrode.

8. The apparatus of claim 7 wherein the means for preventing transistor conduction decouples a source of the operating voltage and current from the main current conducting path.

9. The apparatus of claim 7 wherein the means for preventing transistor conduction decouples a source of the operating voltage and current from the main current conducting path and decouples the drive current from the control electrode.

10. The apparatus of claim 4, 5 or 6 wherein the means for preventing transistor conduction is responsive to the main conducting path going from saturation to not being at saturation while drive current is being applied to the control electrode.

11. The apparatus of claim 10 wherein the means for preventing transistor conduction decouples the drive current from the control electrode.

12. The apparatus of claim 4, 5 or 6 wherein the means for preventing transistor conduction is responsive to (a) the transistor not being in saturation upon completion of a predetermined interval after the drive current is initially applied to the control electrode, the predetermined interval being at least the time required for the transistor to become saturated after drive current is initially supplied to the control electrode, and (b) the main conducting path going from saturation to not being at saturation while drive current is being applied to the control electrode.

13. The apparatus of claim 12 wherein the means for preventing transistor conduction in response to (a) decouples a source of operating voltage and current from the main current conducting path.

14. The apparatus of claim 12 wherein the means for preventing transistor conduction in response to (b) decouples the drive current from the control electrode.

15. A method of protecting against a fault in a main current conducting path of a transistor activated into saturation between first and second opposite electrodes of the path in response to a drive current applied to a control electrode of the transistor, the fault occurring with drive current being applied to the control electrode while the transistor is not in saturation, comprising:

preventing conduction of the transistor main current path in response to the transistor not being activated to saturation while drive current is being applied to the control electrode by decoupling from the main current conducting path a source of operating voltage and current normally applied to the main current conducting path.

16. The method of claim 15, wherein the saturation is detected by monitoring the voltage between the electrodes, the transistor not being in saturation and being in saturation in response to the voltage between the electrodes being greater than and not greater than a predetermined level.

17. The method of claim 15, wherein conduction of the transistor is prevented in response to the transistor not being in saturation upon completion of a predetermined interval after the drive current is initially applied to the control electrode, the predetermined interval being at least the time required for the transistor to become saturated after drive current is initially applied to the control electrode.

* * * * *